United States Patent [19]

Bihuniak et al.

[11] Patent Number: 4,911,896

[45] Date of Patent: Mar. 27, 1990

[54] FUSED QUARTZ MEMBER FOR USE IN SEMICONDUCTOR MANUFACTURE

[75] Inventors: Peter P. Bihuniak, Shaker Heights; Gordon E. Dogunke, Cleveland; Robert D. Shelley, Chesterland, all of Ohio

[73] Assignee: General Electric Company, Schenectady, N.Y.

[21] Appl. No.: 889,142

[22] Filed: Jul. 24, 1986

[51] Int. Cl.$^4$ .............................................. C30B 15/10
[52] U.S. Cl. .......................... 422/249; 156/DIG. 83; 432/264
[58] Field of Search ................ 156/601, 606, 617 SP, 156/617 H, DIG. 83; 373/156, 157, 163, 122; 422/248, 249; 432/262, 263, 264, 265; 501/39, 54, 86; 65/18.1, 33, 36

[56] References Cited

U.S. PATENT DOCUMENTS

| | | | |
|---|---|---|---|
| 3,370,921 | 2/1968 | Wagstaff | 501/54 |
| 3,472,667 | 10/1969 | Wagstaff | 423/335 |
| 3,501,406 | 3/1970 | Kappelmeyer et al. | 156/606 |
| 3,804,682 | 4/1974 | Keller | 156/606 |
| 4,033,780 | 7/1977 | Baumgartner et al. | 106/69 |
| 4,042,361 | 8/1977 | Bihuniak et al. | 65/18 |
| 4,055,391 | 10/1977 | Schmidt et al. | 432/265 |
| 4,238,274 | 12/1980 | Chu et al. | 156/DIG. 83 |
| 4,416,680 | 11/1983 | Bruning et al. | 65/144 |
| 4,528,163 | 7/1985 | Albrecht | 156/DIG. 83 |

Primary Examiner—John Doll
Assistant Examiner—R. Bruce Breneman
Attorney, Agent, or Firm—Philip L. Schlamp; J. F. McDevitt; Edward M. Corcoran

[57] ABSTRACT

A composite fused quartz material is disclosed for processing semiconductor grade silicon material in an improved manner. The modified vitreous material includes a disperse phase of fine size silicon metal particles which are distributed in preselected regions of the fused quartz matrix as a means of exercising temperature control in the various semiconductor processing operations using these fused quartz parts. Such utilization of the modified vitreous material in single crystal silicon rod growth and production of semiconductor grade silicon by diffusion doping is described. A method to produce the modified vitreous material is also disclosed.

9 Claims, 1 Drawing Sheet

FUSED QUARTZ MEMBER FOR USE IN SEMICONDUCTOR MANUFACTURE

BACKGROUND OF THE INVENTION

Semiconductor grade silicon is conventionally grown as a single crystal from a molten batch of polysilicon contained in a fused quartz vessel. The Czochralski method for doing so draws a single crystal silicon rod from the molten polysilicon mass at elevated temperatures often exceeding 1450° C. and which now is carried out in a batch or continuous manner. Careful control of the operating temperatures must be exercised for numerous reasons to maintain a satisfactory yield of the semiconductor material being produced in such manner. To illustrate, in a typical manufacturing method heaters are employed along with heat shields to carefully control both axial and radial temperatures in the melt. By controlling temperature along with the rod pulling rate in said method, the diameter of the growing crystal is thereby controlled. As a single crystal is being pulled in such batch type process operation, the melt level in the crucible container also drops so that automatically controlled elevation of said crucible is commonly employed to avert undesired changes in the thermal profile during the growth process. It can thereby be appreciated that controlling the temperature distribution in this method remains a critical consideration.

Similarly, careful temperature control is exercised when producing a silicon semiconductor element by doping the above described single crystal material at elevated temperatures with a gaseous atmosphere containing a doping element. In this commercial process, the single crystal material is heated in a closed vessel of fused quartz and the gaseous atmosphere admitted for thermal diffusion of the doping element into the single crystal material. The fused quartz vessel commonly employed is a hollow cylinder closed at both ends which is often fabricated with optically clear fused quartz so as to enable penetration of the infrared heating energy being again supplied from surrounding heater elements. Since undesirable temperature fluctuations can occur in said diffusion process from heat losses experienced in a variety of ways, the control of temperature distribution in this equipment also remains important. It becomes desirable, therefore, to modify the fused quartz material now used in the overall thermal processing of semiconductor grade silicon in a manner which helps control the temperature distribution during the particular processing operations.

SUMMARY OF THE INVENTION

It has now been discovered, surprisingly, that controlled amounts of silicon metal crystals can be introduced into a fused quartz matrix in a particular manner to retard infrared heating energy passage through said modified material. More particularly, a disperse phase of fine size silicon metal particles having a spherical shape is distributed in preselected regions to form a composite fused quartz member exhibiting the modified behavior selectively in the disperse phase regions. For example, a crucible member can be formed with said modified fused quartz material having the preselected regions limited to the top wall portions of said vessel for use in the above described single crystal growth process. In this manner, the heating energy employed in said process easily penetrates the unmodified fused quartz regions of the crucible but is effectively retarded from entry at the upper wall regions. Temperature control can thereby be exercised during the growth process with said modified fused quartz member whereby the heating energy will be supplied primarily to the central region of the polysilicon melt while maintaining a top region of said melt at a somewhat cooler temperature which is deemed a desirable operating condition. As further indicated above, the fused quartz members now being employed as thermal shields or baffles in this growth process can also be modified in the same general manner to reduce heat losses from the polysilicon melt that are otherwise encountered.

In different embodiments suitable for use in the above described thermal diffusion process, the fused quartz vessel includes at least one composite fused quartz member according to the present invention again serving to control temperature distribution in the semiconductor grade material being processed. To illustrate, the optically clear fused quartz diffusion tube now commonly employed can be modified at one or both closed-end regions to utilize components fabricated with the presently modified composite fused quartz material. Plates or disks of said composite material can thereby serve as end closures for said diffusion tube and reduce heat losses occurring at this location of the closed vessel. As such, said end closures would further protect O-ring seal structures now employed to provide a gas tight seal in these diffusion tubes. Hollow tube shapes of the composite fused quartz material can also be joined at one or both ends of said optically clear fused quartz diffusion tube to block the heat losses otherwise encountered from longitudinal heat passage within the optically clear tube walls by a "light piping" effect.

The specific composite fused quartz material suitable for use in the foregoing manner can be further characterized as a fused quartz or vitreous matrix having a occluded bubbles which further contains from about 25 ppm up to about 2000 ppm by weight of the fine size spherically shaped silicon metal crystals uniformly distributed throughout the fused quart matrix in preselected regions serving to reduce infrared optical transmission at said regions to a room-temperature value no greater than about 30% for a 3 mm sample thickness. The total content of other metal impurities in said fused quartz member does not exceed about 100 ppm by weight to avert contamination of the silicon semiconductor material being processed. Said improved composite fused quartz material can be prepared by modest modifications to already known quartz manufacturing processes whereupon the silicon metal crystals ranging in particle size from submicron size up to about 15 microns in diameter are mixed in the above disclosed weight proportions with crystalline quartz particles to form a starting material for subsequent fusion by otherwise conventional quartz manufacturing processes. During the quartz fusion step, some chemical reaction is observed to take place between said silicon metal crystals and the quartz particles causing the silicon crystals to adopt a spherical shape while further producing a slight discoloration in the otherwise colorless translucent fused quartz matrix. Either a natural quartz sand or a crushed quartz crystal can be selected for use in said quartz starting mixture and thereafter purified by chemical treatment such as disclosed in a prior issued of U.S. Pat. No. 3,764,286 assigned to the present assignee. Silicon metal addition in said starting mixture below the above specified 25 ppm lower limit has not been found to produce sufficient reduction of infrared energy passage in the final composite fused quartz member. On the other hand, silicon metal addition greater than the above specified 2000 ppm maximum level is deemed undesirable in that excessive heating energy will be required to adequately fuse such mixtures.

It will be apparent from the foregoing summary description that the present invention in its most basic form utilizes such composite fused quartz material to advantage when thermally processing semiconductor grade silicon. Accordingly, this invention is practiced in one preferred embodiment to provide an improved method or drawing single crystal silicon from a molten polysilicon mass at elevated temperatures which comprises:

(a) melting a polysilicon mass at elevated temperatures employing at least one composite fused quartz member having occluded bubbles which contains from about 25 ppm up to about 2000 ppm by weight of fine size spherically-shaped silicon metal crystals uniformly distributed throughout the fused quartz matrix in preselected regions of said fused quartz member so as to reduce infrared optical transmission through said preselected regions to a room-temperature value no greater than about 30% at a 3 mm sample thickness, said fused quartz member being further characterized by a total content of other metal impurities not exceeding about 100 ppm by weight, and (b) drawing a single crystal silicon rod from said molten polysilicon mass, whereupon;

(c) the preselected regions of said fused quartz members serve to control temperature distribution in said drawing process. Similarly, said invention can also be practiced in a different preferred embodiment to provide an improved method to form a silicon semiconductor element by doping semiconductor grade single-crystal silicon material at elevated temperatures with a gaseous atmosphere containing a doping element which comprises:

(a) heating the semiconductor grade material in a closed vessel which includes at least one composite fused quartz member having a fused quartz matrix which contains from about 25 ppm up to about 2000 ppm by weight of fine size spherically-shaped silicon metal crystals uniformly distributed throughout the fused quartz matrix in preselected regions of said fused quartz vessel so as to reduce infrared optical transmission through said preselected regions to a room-temperature value no greater than about 30% at a 3 mm sample thickness, said fused quartz vessel being further characterized by a total content of other metal impurities not exceeding 100 ppm by weight, and (b) admitting said gaseous atmosphere at the elevated temperatures to the fused quartz vessel for diffusion of the doping element in the semiconductor grade material, whereupon (c) the preselected regions of said fused quartz vessel serve to control temperature distribution in the semiconductor grade material being treated. In both of said improved methods, the principal benefit attributable to said selective infrared transmission decrease through the modified composite fused quartz member is increased control of the heat transfer taking place in said processing equipment.

DETAILED DESCRIPTION OF THE PREFERRED EMBODIMENTS

Figure 1:
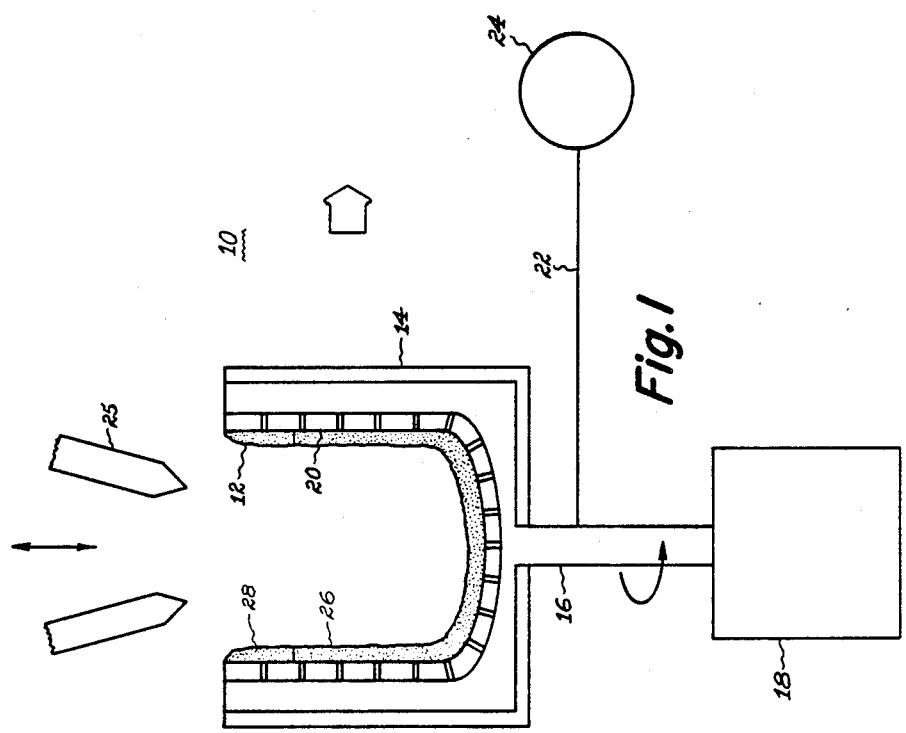
FIG. 1 illustrates schematically an apparatus suitable for carrying out the formation of a modified fused quartz crucible in accordance with the present invention.

There is depicted schematically in FIG. 1 an already known apparatus 10 to form a fused quartz crucible 12 as more fully described in U.S. Pat. No. 4,416,680. In accordance with said procedure, crystalline quartz particles are first admitted into a hollow rotating mold to form the crucible shape and thereafter fused with an electric arc. Accordingly, a hollow metal shell 14 is rotatably mounted upon shaft 16 to provide means in which the fusion takes place. A motor drive member 18 rotates the fusion housing assembly to hold the quartz sand mass against the inner walls of the metal shell 14 by centrifugal force. As can be further noted from said drawing, perforations 20 are provided to the inner walls of said metal shell so that fusion of the shaped sand mass can take place under vacuum conditions to reduce the bubble content in the fused quartz member. Such vacuum operation is achieved by connecting a supply conduit 22 that leads from the metal shell to a suitable vacuum pump 24. An electrode assembly 25 is movably mounted above the metal shell to provide a suitable heat source which melts the quartz sand shape contained within said vessel. In customary operation, a quantity of the quartz sand is deposited in the metal shell which is rotated to form a porous shape having the crucible configuration. The vacuum pump exhausts air from the porous sand shape during its subsequent fusion with an electric arc that is provided by the associated electrode assembly. The electrode assembly can be programmed to automatically descend within the metal shell during said fusion step while being withdrawn to its original elevation after the fused quartz vessel has been formed. The entire shell assembly now containing the fused quartz member can thereafter be moved away from said electrode assembly thereby permitting the next fusion operation be carried out with the same electrode assembly.

The above described fusion process can be modified in a preferred embodiment for practice of the present invention by first introducing the customary quartz sand batch in the lower regions 26 of the hollow rotating shell and thereafter adding a quartz sand batch containing the silicon metal particles as above disclosed to the upper region 28 in the still rotating shell. Fusion of the composite sand mass in the customary manner produces a vitreous article wherein the silicon metal containing material is still limited to the upper wall regions of the crucible member. Similarly, the fabrication of a composite fused quartz member in the shape of a hollow cylinder to serve as a thermal shield can be achieved in the same general manner. A rotating mold assembly having said cylindrical shape is provided in said apparatus and a 2-part sand mass as above described thereafter deposited against the inner wall of the rotating hollow form. It becomes possible in said latter embodiment to form pre-selected regions which contain the silicon metal particles at either end of said vitreous article or to provide such pre-selected region extending over the entire inner wall portion of said member.

Figure 2:
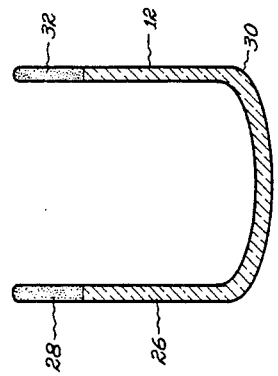
FIG. 2 depicts in cross section the crucible member formed in the FIG. 1 apparatus.

A cross-section of the crucible member 12 formed as described in the above preferred embodiment is depicted in FIG. 2. As can be noted from the drawing, the lower regions 26 for said composite crucible member comprises the customary vitreous phase material having only minute occluded bubbles dispersed throughout the glassy matrix. The upper region 28 for said crucible member further includes a disperse phase of the spherically-shaped silicon metal crystals distributed throughout the glassy matrix for reduced infrared optical transmission according to the present invention. The total content of other metal impurities distributed throughout the composite crucible member is maintained no greater than 100 ppm by weight to avert contaminating nh semiconductor silicon material (not shown) being processed within said containment vessel. While also not shown in said drawing, there can be used other composite fused quartz members for operative association with said composite crucible member in the indicated semiconductor growth process. For example, a cover member for said crucible fabricated with the presently modified fused quartz material helps control temperature distribution when carrying out said growth process by again reducing heat entry at the upper crucible regions. Heating of the crucible contents is enabled at the lower crucible regions in the customary manner.

It will be apparent from the foregoing description that a generally useful improvement has been provided for controlling temperature distribution in the thermal processing of semiconductor grade silicon material. While preferred embodiments of the present invention have been shown and described, however, various other embodiments along with methods of manufacture will become apparent to persons skilled in the art without departing from the true spirit and scope of the present invention. For example, it will be apparent from the foregoing description that still other known quartz manufacturing techniques, such as more fully disclosed in the aforementioned U.S. Pat. No. 3,764,286, can be selected to fabricate certain of the composite fused quartz members for use in accordance with the present invention. Accordingly, the scope of the present invention is limited only by the following claims:

What we claim is new and desire to secure by Letters Patent of the United States is:

1. A composite fused quartz member employed in the drawing of a single crystal silicon rod from a molten polysilicon mass at elevated temperatures which comprises a fused quartz matrix having occluded bubbles which contains a disperse phase of from about 25 ppm up to about 2000 ppm by weight of fine size spherically shaped silicon metal crystals uniformly distributed throughout the fused quartz matrix in at least a portion of said fused quartz member so as to reduce infrared optical transmission through said portion to a room-temperature value no greater than about 30% at a 3 mm sample thickness, said fused quartz member being further characterized by a total content of other metal impurities not exceeding 100 ppm by weight, wherein that portion of said fused quartz member which contains said disperse phase serves to control temperature distribution in the drawing process.

2. A fused quartz member as in claim 1 having the shape of a closed-end hollow vessel.

3. A fused quartz member as in claim 2 wherein that portion which contains said disperse phase is located at the top wall portions of said vessel.

4. A fused quartz member as in claim 1 having the shape of a ;hollow cylinder serving as a thermal shield.

5. A fused quartz member as in claim 1 having the shape of a cylindrical disc.

6. A composite fused quartz member employed in the formation of a semiconductor element by doping semiconductor grade single-crystal silicon material at elevated temperatures with a gaseous atmosphere containing the doping element which comprises a closed vessel that includes at least one composite fused quartz member having a fused quartz matrix having occluded bubbles which contains a disperse phase of from about 25 ppm up to about 2000 ppm by weight of fine size spherically-shaped silicon metal crystals uniformly distributed throughout the fused quartz matrix in at least a portion of said composite fused quartz member so as to reduce infrared optical transmission through said portion to a room-temperature value no greater than about 30% at a 3 mm sample thickness, said composite fused quartz member being further characterized by a total content of other metal impurities not exceeding 100 ppm by weight wherein that portion of said fused quartz vessel which contains said disperse phase serves to control temperature distribution in the semiconductor material being treated.

7. A fused quartz vessel as in claim 6 in the shape of a closed-end hollow cylinder.

8. A fused quartz vessel as in claim 6 wherein that portion or portions of said fused quartz vessel which contain said disperse phase are limited to the closed-ends.

9. A fused quartz vessel as in claim 7 wherein the central portion of said closed-end cylinder further includes optically clear fused quartz.

* * * * *